US012804884B2

(12) United States Patent
Yan

(10) Patent No.: US 12,804,884 B2
(45) Date of Patent: Nov. 17, 2026

(54) SEMICONDUCTOR DEVICE AND METHOD OF FABRICATING THE SAME

(71) Applicant: Fujian Jinhua Integrated Circuit Co., Ltd., Quanzhou City (CN)

(72) Inventor: Yifei Yan, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 671 days.

(21) Appl. No.: 18/221,860

(22) Filed: Jul. 13, 2023

(65) Prior Publication Data

US 2024/0306373 A1 Sep. 12, 2024

(30) Foreign Application Priority Data

Mar. 9, 2023 (CN) ......................... 202310220282.5
Mar. 9, 2023 (CN) ......................... 202320429767.0

(51) Int. Cl.
*H10B 12/00* (2023.01)

(52) U.S. Cl.
CPC ........... *H10B 12/482* (2023.02); *H10B 12/02* (2023.02); *H10B 12/315* (2023.02); *H10B 12/34* (2023.02)

(58) Field of Classification Search
CPC .... H10B 12/482; H10B 12/02; H10B 12/315; H10B 12/34; H10B 12/0335; H10B 12/053
See application file for complete search history.

(56) References Cited

U.S. PATENT DOCUMENTS

| | | | | |
|---|---|---|---|---|
| 9,859,283 | B1 | 1/2018 | Feng | |
| 11,411,010 | B2 | 8/2022 | Seong et al. | |
| 2013/0328160 | A1* | 12/2013 | Ota | H10B 12/488 257/506 |
| 2016/0049407 | A1 | 2/2016 | Son | |
| 2019/0273083 | A1* | 9/2019 | Liou | H10B 12/01 |
| 2020/0203215 | A1* | 6/2020 | Jang | H10W 10/0143 |
| 2023/0247823 | A1* | 8/2023 | Cho | H10B 12/0335 257/296 |
| 2023/0411387 | A1 | 12/2023 | Zhang | |

FOREIGN PATENT DOCUMENTS

KR 10-2016-0021962 A 2/2016

* cited by examiner

*Primary Examiner* — Samuel Park
(74) *Attorney, Agent, or Firm* — Winston Hsu

(57) ABSTRACT

Present invention relates to a semiconductor device and a method of fabricating the same including a substrate, a plurality of word lines, a dielectric layer, and a plurality of bit lines. The word lines are embedded in the substrate to intersect with an active structure and a shallow trench isolation within the substrate. The dielectric layer covers the word lines. The bit lines are disposed over the substrate, along a first direction. The bit lines include at least one first bit line and a plurality of second bit lines, with the first bit line overlapping the active structure and the shallow trench isolation at the same time, and physically contacting the dielectric layer through a bottom surface thereof without being electrically connected to the active structure, and with each of the second bit line including a plurality of bit line contacts disposed therebelow, to directly contact the active structure.

20 Claims, 7 Drawing Sheets

SEMICONDUCTOR DEVICE AND METHOD OF FABRICATING THE SAME

BACKGROUND OF THE INVENTION

1. Field of the Invention

The present disclosure generally relates to a semiconductor device and a method of fabricating the same, and more particularly, to a semiconductor device having an active structure and a shallow trench isolation, and a method of fabricating the same.

2. Description of the Prior Art

With the trend of miniaturization of various electronic products, the design of semiconductor memory devices must meet the requirements of high integration and high density. For a dynamic random access memory (DRAM) having recessed gate structures, because the carrier channel of which is relatively long in the same semiconductor substrate compared with that of the DRAM without recessed gate structures, the leakage current from the capacitor structure in the DRAM can be reduced. Therefore, the DRAM having recessed gate structures has gradually replaced DRAM only having planar gate structures under the current mainstream development trend. Generally, the DRAM having recessed gate structures is constructed by a large number of memory cells which are arranged to form an array area, and each of the memory cells can be used to store information. Each memory cell may include a transistor element and a capacitor element connected in series, which is configured to receive voltage information from word lines (WL) and bit lines (BL). In order to satisfy the requirements of advanced products, the density of memory cells in the array area must be further increased, which increases the difficulty and complexity of related fabricating processes and designs. Therefore, the present technology needs further improvement to effectively improve the efficiency and reliability of related memory devices.

SUMMARY OF THE INVENTION

One of the objectives of the present disclosure provides a semiconductor device and a method of fabricating the same, in which a bit line and a dummy bit line are simultaneously formed without performing extra process. Then, the photolithography process of the present disclosure enables to be carried out under a substantially uniform illuminance, to gain a better yield to the semiconductor device. Accordingly, the present disclosure is allowable to improve the possible structural defects caused by continuously shrinking density of the components, so as to obtain the semiconductor device with more reliable components and functions.

To achieve the purpose described above, one embodiment of the present disclosure provides a semiconductor device including a substrate, a plurality of word lines, a dielectric layer, and a plurality of bit lines. The substrate includes an active structure and a shallow trench isolation. The word lines are embedded in the substrate to intersect with the active structure and the shallow trench isolation. The dielectric layer is disposed on the substrate to cover a top surface of the word lines. The bit lines are disposed over the substrate, along a first direction. The bit lines include at least one first bit line and a plurality of second bit lines disposed at one side of the at least one first bit line, with the at least one first bit line overlapping the active structure and the shallow trench isolation at the same time, and physically contacting the dielectric layer through a bottom surface of the at least one first bit line without being electrically connected to the active structure, and with each of the second bit line including a plurality of bit line contacts disposed therebelow, to penetrate through the dielectric layer to directly contact the active structure.

To achieve the purpose described above, one embodiment of the present disclosure provides a method of fabricating a semiconductor device including the following steps. Firstly, a substrate is provided, with the substrate including an active structure and a shallow trench isolation, and a plurality of word lines is formed in the substrate to intersect with the active structure and the shallow trench isolation. Next, a dielectric layer is formed on the substrate to cover a top surface of the word lines. Then, a plurality of bit lines is formed over the substrate, to extend along a first direction. The bit lines include at least one first bit line and a plurality of second bit lines disposed at one side of the at least one first bit line, wherein the at least one first bit line being overlapped with the active structure and the shallow trench isolation at the same time, and a bottom surface of the at least one first bit line physically contacts the dielectric layer and is not electrically connected to the active structure. Each of the second bit lines includes a plurality of bit line contacts disposed below, and with each of the bit line contacts penetrating through the dielectric layer to directly contact the active structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 1 to FIG. 3 are schematic diagrams illustrating a semiconductor device according to a first embodiment in the present disclosure, wherein:

FIG. 1 is a schematic top view of a semiconductor device according to the first embodiment;

FIG. 2 is a schematic cross-sectional view taken along a cross-line A-A' in FIG. 1; and FIG. 3 is a schematic cross-sectional view taken along a cross-line B-B' in FIG. 1.

FIG. 4 to FIG. 7 are schematic diagrams illustrating a semiconductor device according to a second embodiment in the present disclosure, wherein:

FIG. 4 is a schematic top view of a semiconductor device according to the second embodiment;

FIG. 5 is a schematic cross-sectional view taken along a cross-line A-A' in FIG. 4;

FIG. 6 is a schematic cross-sectional view taken along a cross-line B-B' in FIG. 4; and FIG. 7 is a schematic cross-sectional view taken along a cross-line C-C' in FIG. 4.

FIG. 8 to FIG. 9 are schematic diagrams illustrating a semiconductor device according to a third embodiment in the present disclosure, wherein:

FIG. 8 is a schematic top view of a semiconductor device according to the third embodiment; and FIG. 9 is a schematic cross-sectional view taken along a cross-line D-D' in FIG. 8.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
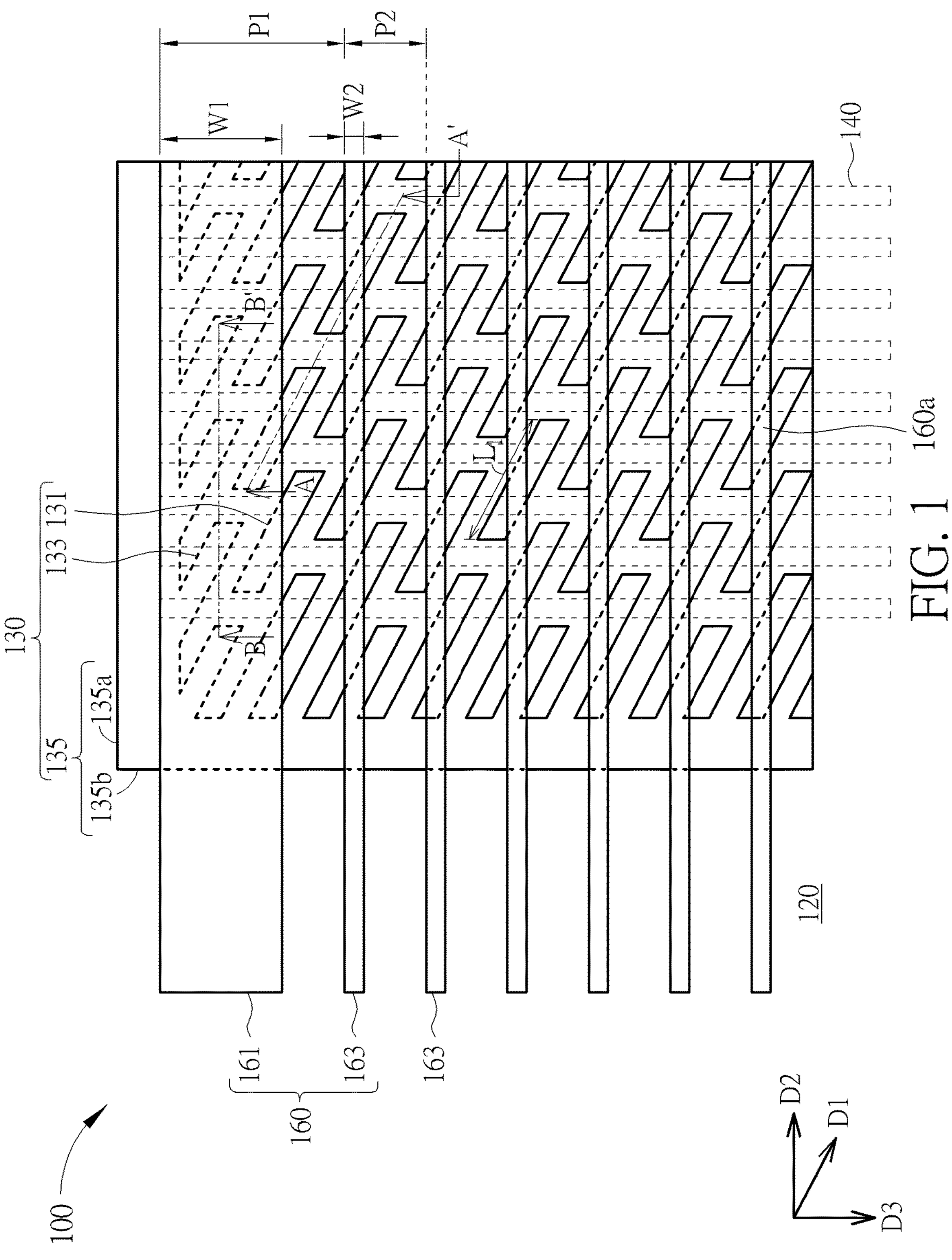
Figure 2:
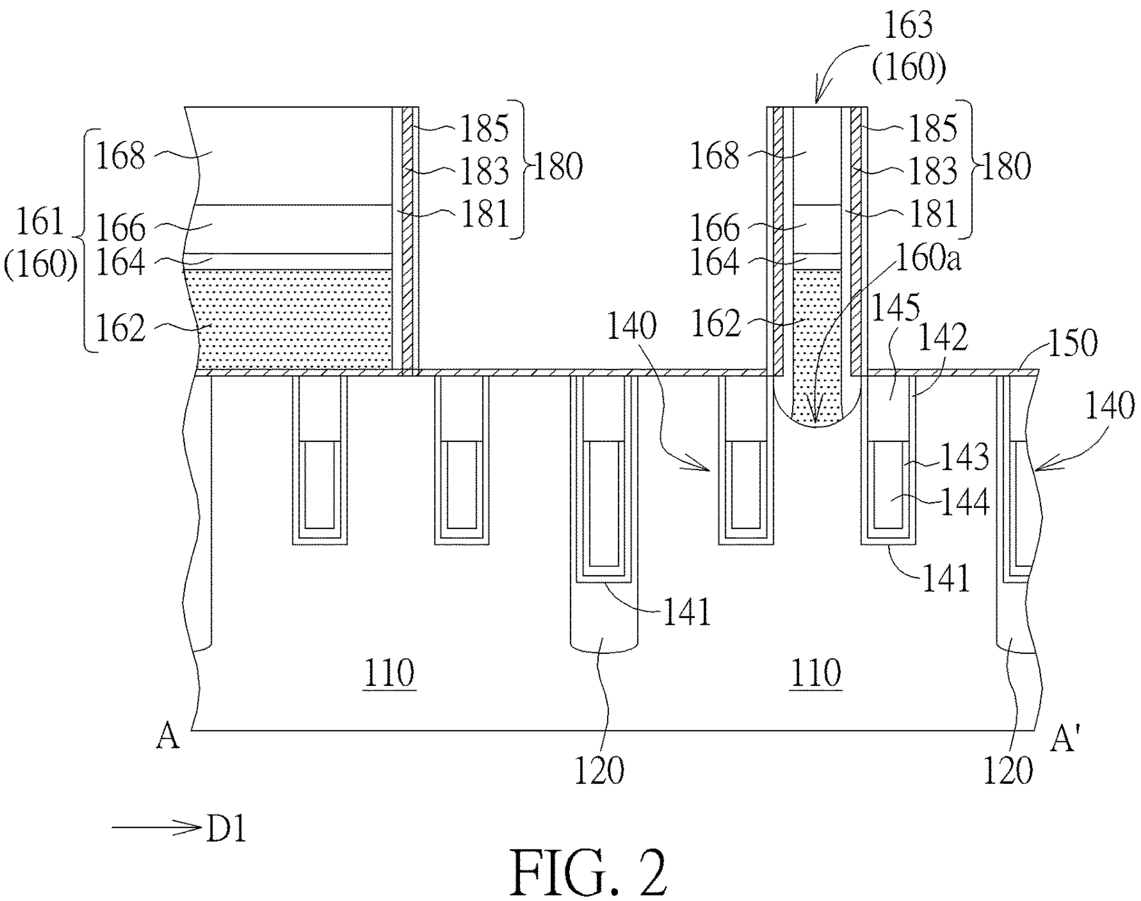
Figure 3:
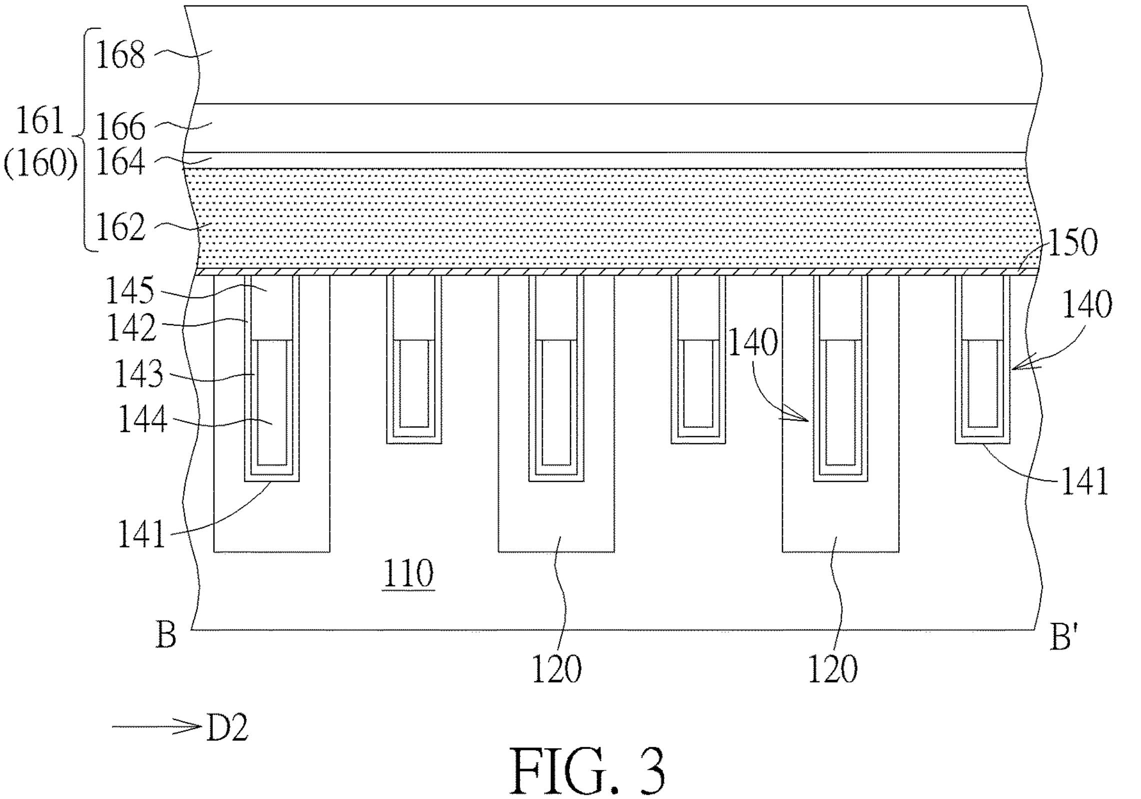

Please refer to FIG. 1 to FIG. 3, illustrating schematic diagrams of a semiconductor device 100 according to the first embodiment in the present disclosure, wherein FIG. 1 shows a schematic top view of the semiconductor device 100, and FIG. 2 and FIG. 3 respectively show a cross-sectional view of the semiconductor device 100 along different cross-lines. The semiconductor device 100 for example includes a substrate 110, such as a silicon substrate, a silicon containing substrate (such as SiC or SiGe), or a silicon-on-insulator (SOI) substrate. The substrate 110 further includes at least one shallow trench isolation (STI) 120 disposed therein to define an active structure 130 in the substrate 110. That is, the shallow trench isolation 120 is disposed around the active structure 130, to be disposed at the outer periphery of the active structure 130.

Precisely speaking, the active structure 130 further includes a plurality of first active fragments 131, a plurality of second active fragments 133, and a third active fragment 135. The first active fragments 131 and the second fragments 133 are parallel extended along a first direction D1, to arrange in a misalignment manner, wherein each of the first active fragments 131 has the same first length L1 in the first direction D1, and each of the second fragments 133 has a length different from the first length L1 in the first direction D1, for example being either greater than or smaller than the first length L1, as shown in FIG. 1. Accordingly, the first active fragments 131 and the second fragments 133 are together arranged in a particular arrangement, such as an array arrangement as shown in FIG. 1, but not limited thereto. The third active fragment 135 is disposed around the outer periphery of all the first active fragments and the second active fragments, to further includes at least one first edge 135*a* extending along a second direction D2 (such as the x-direction), and at least one second edge 135*b* extending along the third direction D3 (such as the y-direction). Accordingly, the whole third active fragment 135 may perform like a rectangular frame (not shown in the drawings) to surround outside the periphery of the first active fragments 131 and the second active fragments 133.

It is noted that, the third active fragment 135 does not directly contact any one of the first active fragments, but directly contacts all of the second active fragments 133. That is, the third active fragment 135 is monolithic with the second active fragments 133. Accordingly, the third active fragment 135 and the second active fragments 133 together form an active area (AA) ring to enclosed around all of the first active fragments 131, with each of the second active fragments 133 serving as an inward extension portion of the third active fragment 135 along the first direction D1, to uniformly disperse the stresses suffered from the active structure 130 and the shallow trench isolation 120. With these arrangements, the active structure 130 may be allowable to obtain a relative stable structure, in order to prevent from structural damage or collapse. People well-skilled in the art should fully realize that the third active fragment 135 is not limited to be the aforementioned rectangular frame, the specific number of the first edge 135*a* and/or the second edge 135*b* may be further adjusted based on practical product requirements, or the third active fragment 135 may further include other edges to present in other shape as a whole thereby.

In one embodiment, the formation of the active structure 130 includes but is not limited to the following fabricating process. Firstly, a bulk silicon substrate (not shown in the drawings) is provided, and a mask layer (not shown in the drawings) is formed on the bulk silicon substrate, with the mask layer including plural patterns for defining the active structure 130, and an etching process is then performed through the mask layer, to partially remove the bulk silicon substrate to form the active structure 130 and a shallow trench (not shown in the drawings) surrounding the active structure 130. Following these, an insulating material (not shown in the drawings) such as including silicon oxide, silicon nitride or silicon oxynitride is filled in the shallow trench, to form the substrate 110 having the active structure 130 and the shallow trench isolation 120, wherein a top surface of the shallow trench isolation is coplanar with the top surface of the substrate 110. Also, in another embodiment, the formation of the first active fragments 131 and the second active fragments 133 may be accomplished by a self-aligned double patterning (SADP) process or a self-aligned reverse patterning (SARP) process, but not limited thereto. It is also noted that, in one embodiment, the first active fragments 131 are preferably formed within a region with a relative higher integration, such as a cell region (not shown in the drawings), and the second active fragments 133 and the third active fragment 135 are disposed within a region with a relative lower integration, such as a periphery region (not shown in the drawings), but not limited thereto.

In addition, the semiconductor device 100 further includes a plurality of buried gate structures 140 embedded in the substrate 110, with each of the gate structures 140 parallel extended along a third direction D3, to intersect the active structure 130 and the shallow trench isolation 120 at the same time. Precisely speaking, as shown in FIG. 2 and FIG. 3, each of the gate structures 140 includes an interface dielectric layer 142, a gate dielectric layer 143, a gate electrode 144 and a covering layer 145 stacked from bottom to top. The covering layer 145 of each of the gate structures 140 has a top surface being coplanar with the top surface of the substrate 110, so that, the gate structures 140 will therefore serve as a plurality of buried word lines (BWL) of the semiconductor device 100 for accepting or transmitting the voltage signals from memory cell (not shown in the drawings) formed in the subsequent process. In one embodiment, the fabrication of the gate structures 140 includes but is not limited to the following steps. Firstly, a plurality of trenches 141 is formed in the substrate 110, and then, the interface dielectric layer 142 and a gate dielectric material layer (not shown in the drawings) which are entirely covering surfaces of each of the trenches 141, and a gate electrode layer (not shown in the drawings) which is filled up each of the trenches 141 are sequentially formed in the trenches 141. Following these, the gate dielectric layer 143 covering bottom surfaces of each of the trenches 141, and the gate electrode 144 filled up the bottom of each of the trenches 141 are formed after etching back the gate electrode layer and the gate dielectric material layer, and the covering layer 145 filled up the top of each of the trenches 141 is then formed in the trenches 141.

On the other hands, the semiconductor device 100 further includes a dielectric layer 150 and a plurality of bit lines (BLs) 160 disposed on the substrate 110. The dielectric layer 150 directly covers the top surface of each of the word lines (namely, the gate structures 140), and the bit lines 160 are disposed on the dielectric layer 150, to parallel extend along the second direction D2 and to intersect the active structure 130, the shallow trench isolation 120 and the word lines at the same time. Also, a bit line spacer 180 is disposed on a sidewall of each bit line 160, and which may include a monolayer structure or a multilayer structure as shown in FIG. 2, with the multilayer structure for example including a first spacer (for example including silicon nitride) 181, a second spacer (for example including silicon oxide) 183, and a third spacer (for example including silicon nitride) 185 stacked sequentially on the sidewall of each obit line 160, but not limited thereto. In one embodiment, the dielectric layer 150 for example includes a multilayer structure, such as an oxide-nitride-oxide (ONO) structure (not shown in the drawings), but not limited thereto.

It is noted that, the bit lines 160 includes at least one first bit line 161 and a plurality of second bit lines 163, the first bit line 161 is disposed at one side of all of the second bit lines 163. The first bit line 161 includes a relative greater first width W1 in the third direction D3, to overlap the AA ring and the first active fragments 131 at the same time, with the overlapped portion with the AA ring including the first edge 135*a*, the second edge 135*b*, and the second active fragments 133 connected to the first edge 135*a* and the second edge 135*b*. Each of the second bit lines 163 includes a relative smaller second width W2, to also overlap the AA ring and the first active fragments 131 at the same time, with the overlapped portion with the AA ring including the second edge 135*b* and the second active fragments 133 connected to the second edge 135*b*, as shown in FIG. 1. The first width W1 of the first bit line 161 is smaller than a first pitch P1 between the first bit line 161 and an adjacent one of the second bit lines 163, and is preferably greater than a distance between the first bit line 161 and the adjacent one of the second bit lines 163 or a second pitch P2 between any two adjacent ones of the second bit lines 163.

Precisely speaking, as shown in FIG. 2 and FIG. 3, each of the bit lines 160 includes a semiconductor layer (for example including a material like polysilicon) 162, a barrier layer (for example including a material like titanium and/or titanium nitride) 164, a conductive layer (for example including a low-resistance metal material like tungsten, aluminum or copper) 166, and a capping layer (for example including a material like silicon oxide, silicon nitride, or silicon oxynitride) 168 sequentially stacked from bottom to top on the dielectric layer 150. The whole structure of the first bit line 161 is disposed over the dielectric layer 150, so that, a bottom surface of the first bit line 161 only physically contacts the top surface of the dielectric layer 150 without contacting the active structure 130. On the other hands, each of the second bit lines 163 further includes a plurality of bit line contacts (BLCs) 160*a* disposed therebelow, so that, each of the bit line contacts 160*a* will penetrate through the dielectric layer 150 to directly contact each of the first active fragments 131 underneath. With these arrangements, each of the second bit lines 163 is allowable to be electrically connected to a transistor (not shown in the drawings) disposed in the substrate 110 via the bit line contacts 160*a*. The first bit line 161 does not include any contact disposed therebelow, and which will not contact or not electrically connect to any first active fragments 131, so as to serve as a dummy bit line (dummy BL).

In one embodiment, the formation of the bit line contacts 160*a* and the bit lines 160 includes but not limited to the following steps. Firstly, another mask layer (not shown in the drawings) is formed on the dielectric layer 150, and an etching process is performed through the another mask layer, to remove a portion of the dielectric layer 150 and a portion of the substrate 110 underneath, to form a plurality of contact openings (not shown in the drawings) between two adjacent ones of the gate structures 140. Then, after removing the another mask layer, a semiconductor material layer (not shown in the drawings) is form to fill in the contact openings, and a barrier material layer (not shown in the drawings), a conductive material layer (not shown in the drawings), and a covering material layer (not shown in the drawings) are sequentially stacked on the semiconductor material layer. After performing a photolithography process, the semiconductor material layer filled in the contact openings forms the bit line contacts 160*a*, and the layers stacked above are patterned to form the bit lines 160. The bit lines 160 includes the second bit lines 163 being overlapped and directly in contact with the bit line contacts 160*a*, and the first bit line 163 being not overlapped with any bit line contact 160*a*. In this way, the formation of the first bit line 161 (the dummy bit line) and the second bit lines 163 (the general bit lines) may be accomplished through the same fabricating process, and the bit line contact 160*a* and the second bit lines 163 are monolithic, but not limited thereto.

Through the aforementioned arrangements, the fabrication of the semiconductor device 100 according to the first embodiment of the present disclosure is accomplished. According to the present embodiment, the semiconductor device 100 includes both of the first bit line 161 with a relatively greater width (the first width W1) and the second bit lines 163 with a relatively smaller width (the second width W2). By using the first bit line 161 without contacting to the active structure 130 to serve as the dummy bit line, the formation of all of the bit lines 160 may be carried out via the same process under a substantially uniform illuminance. In this way, the semiconductor device 100 fabricated accordingly in the present disclosure will therefore gain a better reliability and optimum device performance. Also, the first bit line 161 includes the relative greater first width W1 and the first pitch P1, to dramatically enlarge the process tolerance or the process window of the peripheral components, and to avoid the negative influence on the overall structure of the semiconductor device caused by the micro-load effect or the possible etching defects due to various integrations of the peripheral components during the fabricating process. Accordingly, the present disclosure is allowable to improve the possible structural defects caused by continuously shrinking density of the components. In addition, as the dummy bit line (the first bit line 161) and the general bit lines (the second bit lines 163) are simultaneously formed through the same fabricating process in the present disclosure, the semiconductor device 100 having the improved functions and more reliable components is effectively fabricated under a simplified process flow without performing any extra process.

However, people in the art should fully realize that the semiconductor device and the fabricating method thereof are not limited to aforementioned embodiment and may include other examples or may be achieved through other strategies to meet practical product requirements. The following description will detail the different embodiments of the semiconductor device and fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 4:
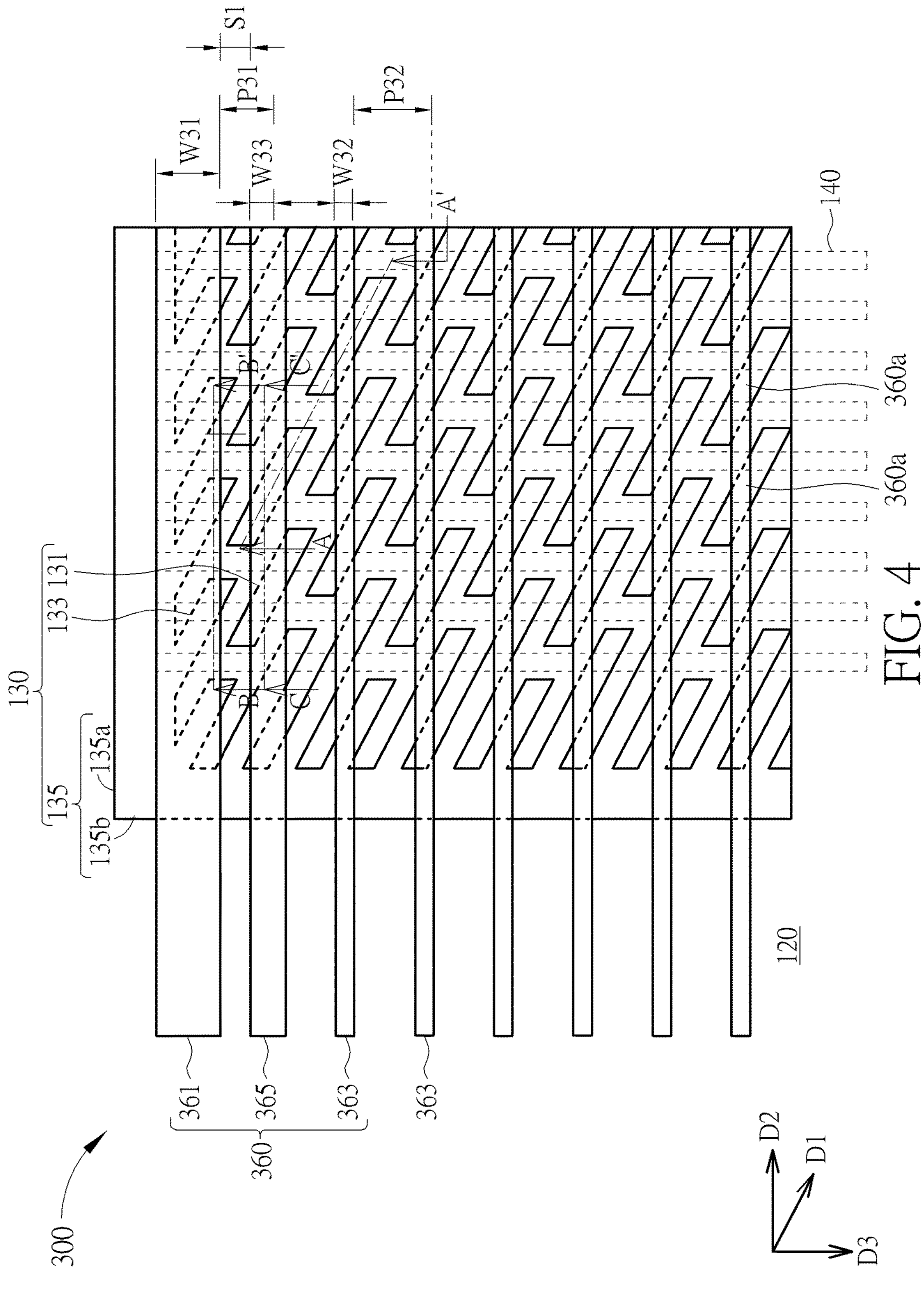
Figure 5:
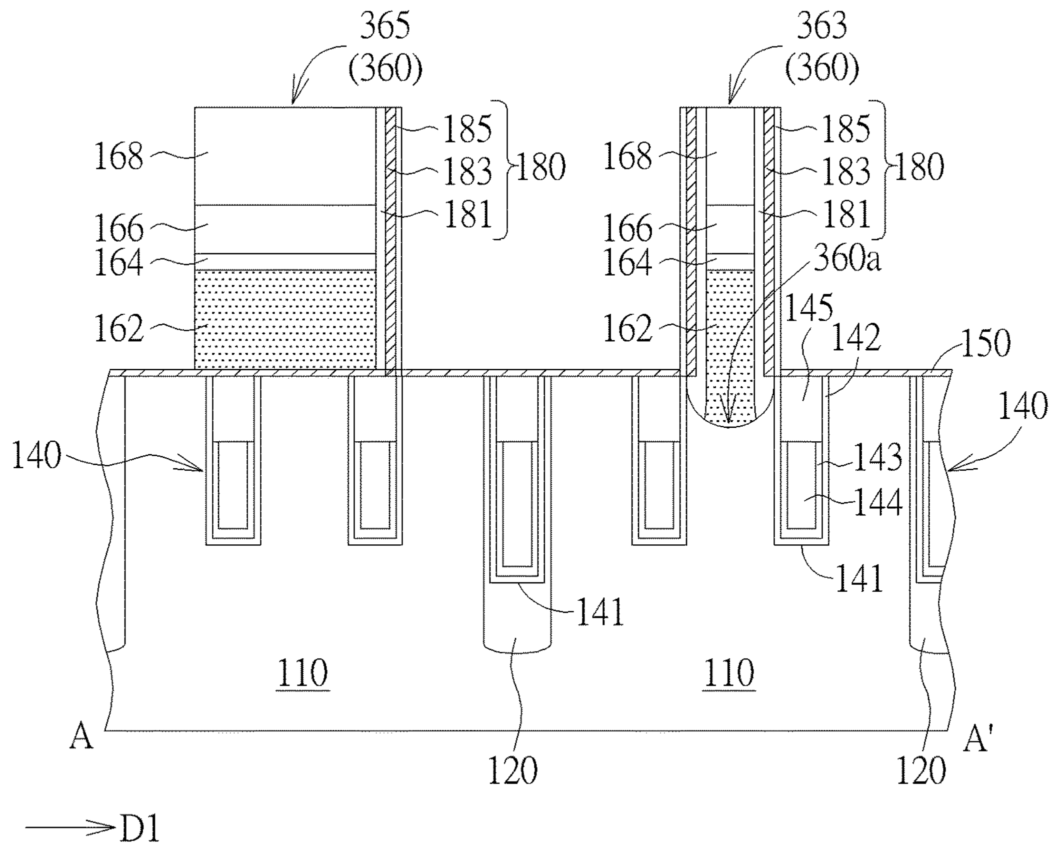
Figure 6:
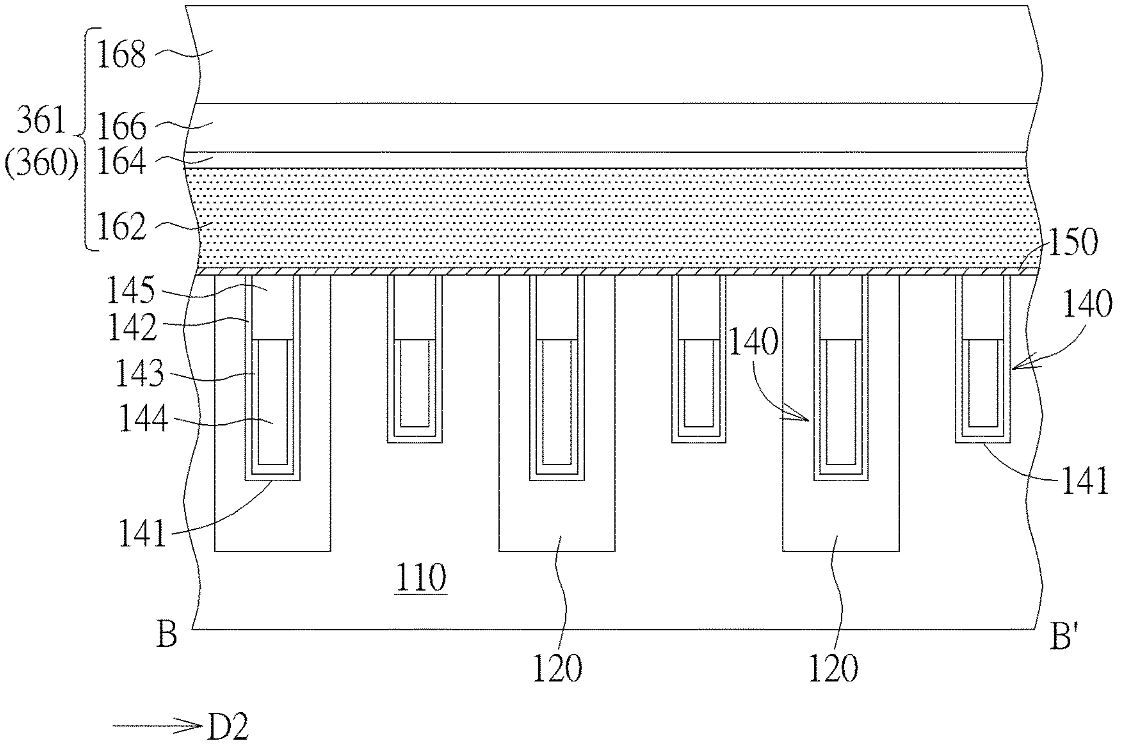
Figure 7:
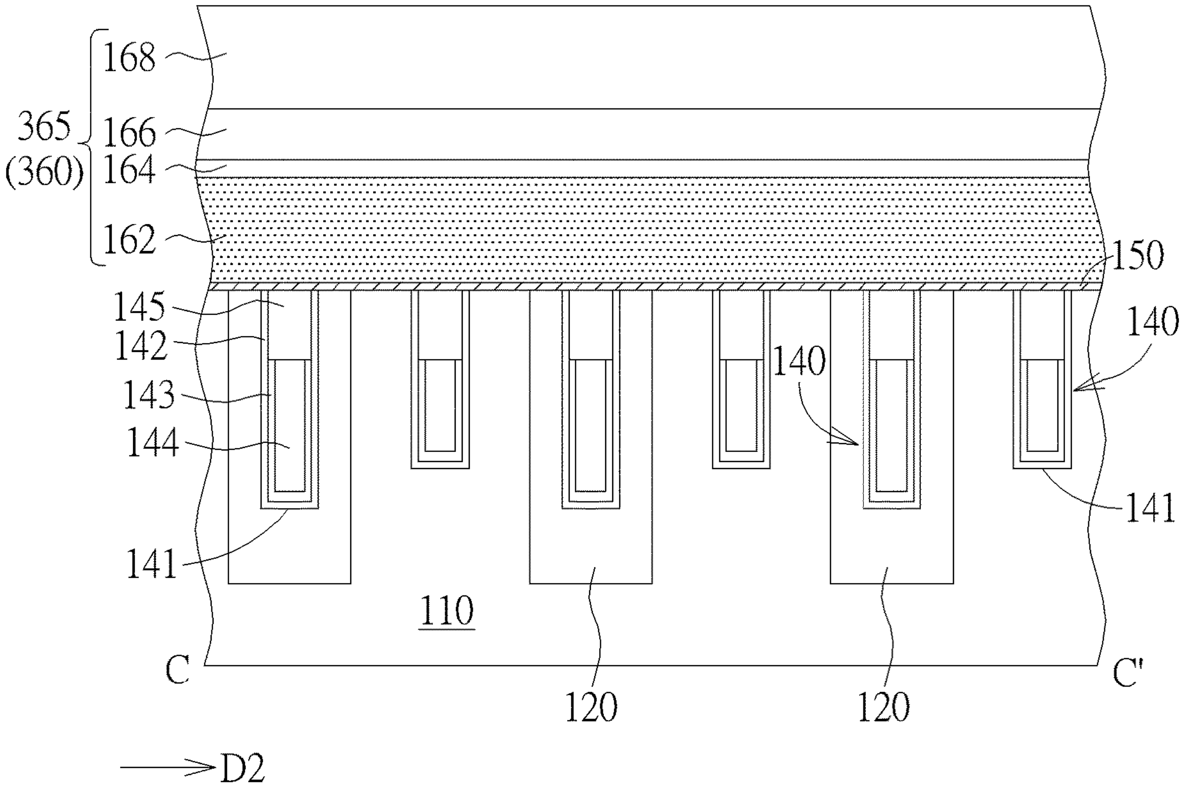

Please refer to FIG. 4 to FIG. 7, illustrating schematic diagrams of a semiconductor device 300 according to the second embodiment in the present disclosure, wherein FIG. 4 shows a schematic top view of the semiconductor device 300, and FIG. 5, FIG. 6 and FIG. 7 respectively show a cross-sectional view of the semiconductor device 300 along different cross-lines. The structure of the semiconductor device 300 in the present embodiment is substantially the same as that of the semiconductor device 100 of the aforementioned first embodiment, and all the similarities will not be redundantly described herein after. The difference between the semiconductor device 300 of the present embodiment and the semiconductor device 100 of the aforementioned first embodiment is in that bit lines 360 of the present embodiment further includes at least one third bit line 365, between a first bit line 361 and a plurality of second bit lines 363 in the third direction D3, as shown in FIG. 4.

It is noted that, in the present embodiment, the first bit line 361 also includes a relative greater first width W31, to only overlap the AA ring, with the overlapped portion with the AA ring including the first edge 135*a*, the second edge 135*b*, and the second active fragments 133 connected to the first edge 135*a* or the second edge 135*b*, without overlapping any one of first active fragments 131. Each of the second bit lines 363 includes a relative smaller second width W32, to overlap the AA ring and the first active fragments 131 at the same time, with the overlapped portion with the AA ring including the second edge 135*b* and the second active fragments 133 connected to the second edge 135*b*. The third bit line 365 includes a third width W33 being greater than the second width W32 and smaller than first width W31, to also overlap the AA ring and the first active fragments 131 at the same time, with the overlapped portion with the AA ring including the second edge 135*b* and the second active fragments 133 connected to the second edge 135*b*. As shown in FIG. 4, a space S1 between the third bit line 365 and the first bit line 361 is greater than the second width W32, and also, a first pitch P31 between the first bit line 361 and the third bit line 365 is smaller than a second pitch P32 between two adjacent ones of the second bit lines 363.

Precisely speaking, as shown in FIG. 5 to FIG. 7, each of the bit lines 360 includes the semiconductor layer (for example including a material like polysilicon) 162, the barrier layer (for example including a material like titanium and/or titanium nitride) 164, the conductive layer (for example including a low-resistance metal material like tungsten, aluminum or copper) 166, and the capping layer 168 (for example including a material like silicon oxide, silicon nitride, or silicon oxynitride) sequentially stacked from bottom to top on the dielectric layer 150. Then, the whole structure of the first bit line 361 and the third bit line 365 are respectively disposed over the dielectric layer 150, with the bottom surfaces of the first bit line 361 and the third bit line 365 only physically contacting the top surface of the dielectric layer 150, without contacting the active structure 130, to together serve as the dummy bit lines of the semiconductor device 300. On the other hands, each of the second bit lines 363 directly contacts the corresponding ones of the first active fragments 131 through the bit line contacts 360*a* underneath, with the bit line contacts 360*a* penetrating through the dielectric layer 150 to electrically connect to a transistor (not shown in the drawings) formed in the substrate 110 in the subsequent process. People well-skilled in the art should fully realize that the fabrication process of each component in the present embodiment is substantially the same as those of the aforementioned embodiment, and will not be redundantly described herein after.

Through the aforementioned arrangements, the fabrication of the semiconductor device 300 according to the second embodiment of the present disclosure is accomplished. According to the present embodiment, the semiconductor device 300 includes the first bit line 361 and the third bit line 365 with a relatively greater width (the first width W31 and the third width W33) respectively to serve as the dummy bit lines, and the second bit lines 363 with a relatively smaller width (the second width W32), so that, the formation of all of the bit lines 360 may be carried out through the same fabricating process under a substantially uniform illuminance. In this way, the semiconductor device 300 fabricated accordingly in the present embodiment may also obtain a better reliability and an optimized device performance. Furthermore, since both of the third width W33 of the third bit line 365, and the space S1 between the third bit line 365 and the first bit line 361 is greater than the second width W32 of each second bit line 363, the process tolerance or the process window of the peripheral components may be efficiently enlarged, and the negative influence on the overall structure of the semiconductor device caused by the micro-loading effect or the possible etching defects may also be avoided thereby. Accordingly, the present disclosure is allowable to improve the possible structural defects caused by continuously shrinking density of the components. In addition, as the dummy bit line (the first bit line 361 and the third bit line 365) and the general bit lines (the second bit lines 363) are simultaneously formed through the same fabricating process in the present disclosure, the semiconductor device 300 with the improved functions and reliability is effectively fabricated under a simplified process flow without performing any extra process.

Figure 8:
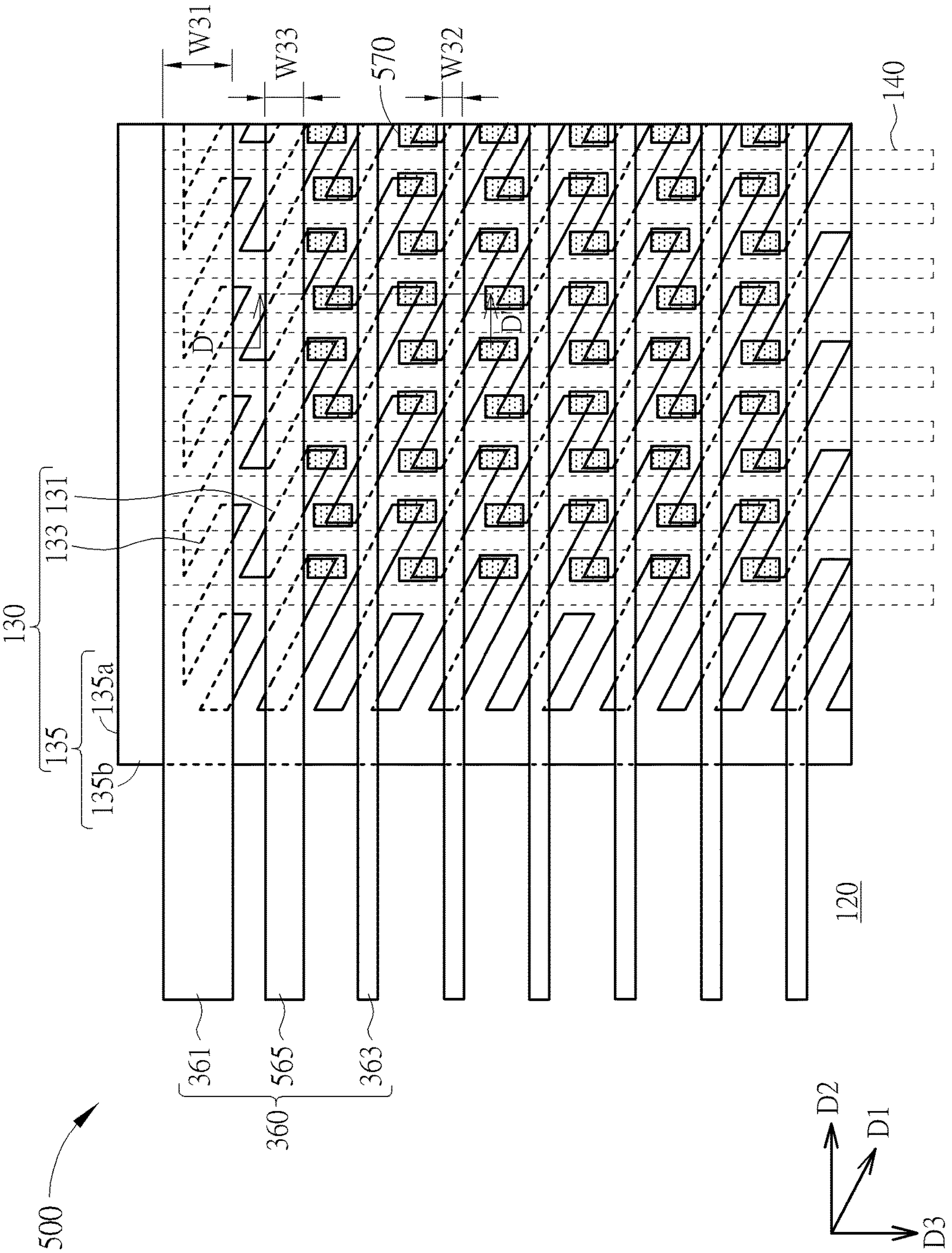
Figure 9:
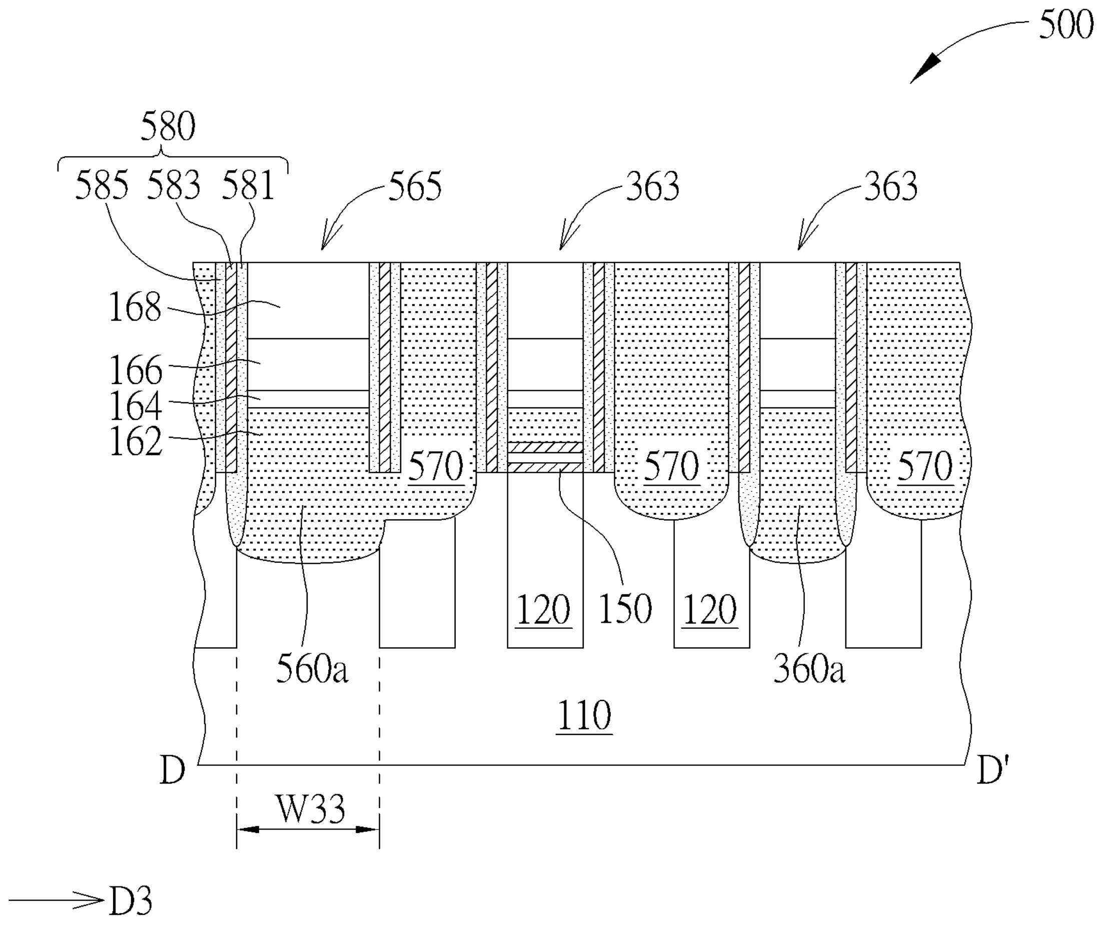

Please refer to FIG. 8 to FIG. 9, illustrating schematic diagrams of a semiconductor device 500 according to the third embodiment in the present disclosure, wherein FIG. 8 shows a schematic top view of the semiconductor device 500, and FIG. 9 shows a cross-sectional view of the semiconductor device 500. The structure of the semiconductor device 500 in the present embodiment is substantially the same as that of the semiconductor device 300 of the aforementioned second embodiment, and all the similarities will not be redundantly described herein after. The difference between the semiconductor device 500 of the present embodiment and the semiconductor device 300 of the aforementioned second embodiment is in that a plurality of bit line contacts 560*a* is additionally disposed below a third bit line 565, and at least one of the bit line contacts 560*a* directly contacts a storage node contact 570.

Precisely speaking, as shown in FIG. 8 and FIG. 9, the semiconductor device 500 of the present embodiment further includes a plurality of storage node contacts 570, separately disposed on the substrate 110, and the storage node contacts 570, the second bit lines 363 and the third bit line 565 are alternately arranged along the third direction D3. Each of the storage node contacts 570 penetrates through the dielectric layer 150, to directly contact a corresponding one of the first active fragments 131 and the shallow trench isolation 120 in the substrate 110. In one embodiment, the storage node contacts 570 for example includes a low-resistance metal material like aluminum, titanium, copper, or tungsten, and preferably includes a material the same as that of the bit line contacts 360*a*, 560*a*, but not limited thereto. Also, each of the storage node contacts 570 and each of the second bit lines 363 and the third bit line 565 are isolated from each other by a spacer structure 580 (not shown in FIG. 8), and the spacer structure 580 optionally includes a monolayer structure or a multilayer structure as shown in FIG. 9. The multilayer structure for example includes a first spacer (for example including silicon nitride) 581, a second spacer (for example including silicon oxide) 583, and a third spacer (for example including silicon nitride) 585 stacked sequentially on sidewalls of each second bit line 363 and the third bit line 565, but not limited thereto.

In one embodiment, the fabricating process of the storage node contacts 570 may include but is not limited to the following steps. Firstly, another mask layer (not shown in the drawings) is formed on the bit lines 360, and an etching process is performed through the another mask layer, to remove a portion of the dielectric layer 150 to form a plurality of contact openings (not shown in the drawings), exposing each of the first active fragments 131 underneath and the substrate 110 at two sides thereof. Then, a plurality of contacts is formed on the substrate 110, to electrically connect the exposed substrate 110 to serve as the storage node contacts 570. In another embodiment, the formation of the storage node contacts 570 may be accomplished by a self-aligned double patterning process or a self-aligned reverse patterning process.

It is noted that, since the third bit line 565 of the present embodiment includes a relative greater third width W33, the bit line contacts 560*a* disposed below the third bit line 565 will obtain a relative greater extending area accordingly, even partially extending to the location of the storage node contacts 570. Thus, at least one bit line contact 560*a* will directly contacts the storage node contacts 570, to electrically connect the storage node contacts 570 to form a short circuit. Accordingly, the bit line 565 is still functioned like a dummy bit line in the present embodiment, and which will not electrically connect to a transistor (not shown in the drawings) disposed in the substrate 110.

Through the aforementioned arrangements, the fabrication of the semiconductor device 500 according to the third embodiment of the present disclosure is accomplished. According to the present embodiment, the semiconductor device 500 includes the first bit line 361 and the third bit line 565 having relatively greater width (the first width W31 and the third width W33), with the entire first bit line 361 being disposed over the dielectric layer 150, and with the third bit line 565 being electrically connected with a portion of the storage node contacts 570 via the bit line contacts 560*a* below the third bit line 565, to respectively serve as a dummy bit line. In this way, the formation of all bit lines 360 may be carried out through the same process under a substantially uniform illuminance, and the semiconductor device 500 fabricated accordingly in the present embodiment may therefore obtain better reliability and device performance. In addition, as the dummy bit lines (including the first bit line 361 and the third bit line 565) and the general bit lines (the second bit lines 363) are simultaneously formed through the same fabricating process in the present embodiment, the semiconductor device 500 with the improved functions and reliability is effectively fabricated under a simplified process flow without performing any extra process.

Overall speaking, according to the fabricating method of the present disclose, the bit lines and the dummy bit lines are simultaneously formed without introducing any extra process, and the photolithography process may be carried out under a substantially uniform illuminance among various regions. The entire dummy bit lines are for example formed over the dielectric layer, without directly contacting the active structure, or electrically connecting the storage node contacts to result in short circuit, so that, the formation of the dummy bit lines are able to be integrated into a general bit line process to avoid increasing the complexity of the fabricating process. Furthermore, the fabricating yield of the semiconductor device is also improved thereby. Thus, the semiconductor device fabricated accordingly in the present disclosure may therefore obtain a better reliability and an optimized device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:

a substrate, comprising an active structure and a shallow trench isolation, wherein the active structure comprises a plurality of first active fragments and an active area ring around the first active fragments, the active area ring comprises a plurality of second active fragments and a third active fragment directly contacting each of the second active fragments, and the first active fragments and the second active fragments are parallel extended along a first direction;

a plurality of word lines, embedded in the substrate to intersect with the active structure and the shallow trench isolation;

a dielectric layer, disposed on the substrate to cover a top surface of the word lines; and a plurality of bit lines, extended along a second direction over the substrate, the bit lines comprising at least one first bit line and a plurality of second bit lines disposed at one side of the first bit line, wherein the at least one first bit line overlaps the active structure and the shallow trench isolation at the same time, and a bottom surface of the at least one first bit line physically contacts the dielectric layer and is not electrically connected to the active structure, wherein each of the second bit lines comprises a plurality of bit line contacts therebelow, and each of the bit line contacts penetrates through the dielectric layer to directly contact the active structure, wherein the bit lines further comprises at least one third bit line, between the at least one first bit line and the second bit lines, and a bottom surface of the at least one third bit line only physical contacts the dielectric layer and is not electrically connected to the active structure, wherein the at least one third bit line overlaps the third active fragment and the second active fragments without directly contacting the third active fragment and the second active fragments.

2. The semiconductor device according to claim 1, wherein the at least one first bit line comprises a first width, each of the second bit lines comprises a second width, and the first width is greater than the second width.

3. The semiconductor device according to claim 2, wherein the first width is greater than a pitch between the second bit lines.

4. The semiconductor device according to claim 1, wherein the at least one first bit line only overlaps the active area ring.

5. The semiconductor device according to claim 1, wherein the at least one first bit line comprises a first width which is greater than a third width of the at least one third bit line, and the third width of the at least one third bit line is greater than a second width of the second bit lines.

6. The semiconductor device according to claim 1, wherein a space between the at least one first bit line and the at least one third bit line is greater than a second width of the second bit lines.

7. The semiconductor device according to claim 1, wherein the at least one first bit line and the at least one third bit line are disposed by a first pitch, and the second bit lines are disposed by a second pitch, and the first pitch is smaller than the second pitch.

8. The semiconductor device according to claim 1, further comprising:

a plurality of storage node contacts disposed on the substrate, and the storage node contacts and the bit lines are alternately arranged with each other; and at least one third bit line, disposed between the at least one first bit line and the second bit lines, wherein at least one bit line contact is disposed under the at least one third bit line to directly contact the storage node contacts.

9. A method of fabricating a semiconductor device, comprising:

providing a substrate, the substrate comprising an active structure and a shallow trench isolation, wherein the active structure comprises a plurality of first active fragments and an active area ring around the first active fragments, the active area ring comprises a plurality of second active fragments and a third active fragment directly contacting each of the second active fragments, and the first active fragments and the second active fragments are parallel extended along a first direction;

forming a plurality of word lines embedded in the substrate, to intersect with the active structure and the shallow trench isolation;

forming a dielectric layer on the substrate to cover a top surface of the word line; and forming a plurality of bit lines on the substrate, the bit lines being extended along a second direction, and comprising at least one first bit line and a plurality of second bit lines disposed at one side of the at least one first bit line, wherein the at least one first bit line overlaps the active structure and the shallow trench isolation at the same time, and a bottom surface of the at least one first bit line physically contacts the dielectric layer and is not electrically connected to the active structure, wherein each of the second bit lines comprises a plurality of bit line contacts therebelow, and each of the bit line contacts penetrate through the dielectric layer to directly contact the active structure, wherein the bit lines further comprises at least one third bit line, between the at least one first bit line and the second bit lines, and a bottom surface of the at least one third bit line only physical contacts the dielectric layer and is not electrically connected to the active structure, wherein the at least one third bit line overlaps the third active fragment and the second active fragments without directly contacting the third active fragment and the second active fragments.

10. The method of fabricating the semiconductor device according to claim 9, wherein the at least one first bit line comprises a first width which is greater than a third width of the at least one third bit line, and the third width of the at least one third bit line is greater than a second width of the second bit lines.

11. The method of fabricating the semiconductor device according to claim 9, wherein a space between the at least one first bit line and the at least one third bit line is greater than a second width of the second bit lines.

12. The method of fabricating the semiconductor device according to claim 9, wherein the at least one first bit line and the at least one third bit line are disposed by a first pitch, and the second bit lines are disposed by a second pitch, and the first pitch is smaller than the second pitch.

13. The method of fabricating the semiconductor device according to claim 9, wherein the at least one first bit line only overlaps the active area ring.

14. The method of fabricating the semiconductor device according to claim 9, further comprising:

forming a plurality of storage node contacts on the substrate, the storage node contacts and the bit lines are alternately arranged with each other, wherein at least one bit line contact is formed under the at least one third bit line to directly contact the storage node contacts.

15. The method of fabricating the semiconductor device according to claim 9, wherein the at least one first bit line comprises a first width, and each of the second bit lines comprises a second width, the first width is greater than the second width, and the first width is greater than a pitch of the second bit lines.

16. A semiconductor device, comprising:

a substrate, comprising an active structure and a shallow trench isolation, wherein the active structure comprises a plurality of first active fragments and an active area ring around the first active fragments, the active area ring comprises a plurality of second active fragments and a third active fragment directly contacting each of the second active fragments, and the first active fragments and the second active fragments are parallel extended along a first direction;

a plurality of word lines, embedded in the substrate to intersect with the active structure and the shallow trench isolation;

a dielectric layer, disposed on the substrate to cover a top surface of the word lines; and a plurality of bit lines, extended along a second direction over the substrate, the bit lines comprising at least one first bit line and a plurality of second bit lines disposed at one side of the first bit line, wherein the at least one first bit line overlaps the active structure and the shallow trench isolation at the same time, and a bottom surface of the at least one first bit line physically contacts the dielectric layer and is not electrically connected to the active structure, wherein each of the second bit lines comprises a plurality of bit line contacts therebelow, and each of the bit line contacts penetrates through the dielectric layer to directly contact the active structure, wherein the bit lines further comprises at least one third bit line, between the at least one first bit line and the second bit lines, and a bottom surface of the at least one third bit line only physical contacts the dielectric layer and is not electrically connected to the active structure, wherein the at least one first bit line comprises a first width which is greater than a third width of the at least one third bit line, and the third width of the at least one third bit line is greater than a second width of the second bit lines.

17. The semiconductor device according to claim 16, wherein the first width is greater than a pitch between the second bit lines.

18. The semiconductor device according to claim 16, wherein the at least one first bit line only overlaps the active area ring.

19. The semiconductor device according to claim 16, wherein the at least one third bit line overlaps the third active fragment and the second active fragments without directly contacting the third active fragment and the second active fragments.

20. The semiconductor device according to claim 16, wherein a space between the at least one first bit line and the at least one third bit line is greater than the second width of the second bit lines.

* * * * *